(12) United States Patent
Grohman et al.

(10) Patent No.: US 6,755,944 B2
(45) Date of Patent: Jun. 29, 2004

(54) ION BEAM DEPOSITION TARGETS HAVING AN INTERLOCKING INTERFACE AND A REPLACEABLE INSERT

(75) Inventors: Henry L. Grohman, Wappingers Falls, NY (US); Robert Acker, Poughquag, NY (US); Matthew T. Wilson, New Milford, CT (US)

(73) Assignee: Williams Advanced Materials, Inc., Buffalo, NY (US)

( * ) Notice: Subject to any disclaimer, the term of this patent is extended or adjusted under 35 U.S.C. 154(b) by 0 days.

(21) Appl. No.: 10/004,212

(22) Filed: Nov. 2, 2001

(65) Prior Publication Data

US 2002/0053512 A1 May 9, 2002

Related U.S. Application Data

(60) Provisional application No. 60/247,427, filed on Nov. 9, 2000.

(51) Int. Cl.[7] ............................................. C23C 14/34
(52) U.S. Cl. ............................ 204/192.11; 204/298.04; 204/298.12
(58) Field of Search ...................... 204/192.11, 298.04, 204/298.12, 298.13, 298.19

(56) References Cited

U.S. PATENT DOCUMENTS

| 5,271,817 A | 12/1993 | Brugge et al. | 204/192.12 |
| 5,522,535 A | 6/1996 | Ivanov et al. | 228/122.1 |
| 5,674,367 A | 10/1997 | Hunt et al. | 204/298.12 |

FOREIGN PATENT DOCUMENTS

| JP | 61-067768 | 9/1984 | C23C/14/34 |
| JP | 63-143258 | 12/1986 | C23C/14/34 |
| JP | 07-138754 | 11/1993 | C23C/14/35 |

Primary Examiner—Rodney G. McDonald
(74) Attorney, Agent, or Firm—Jaeckle Fleischmann & Mugel, LLP

(57) ABSTRACT

An ion beam deposition target source consisting of a removable, centrally located inner insert surrounded by an outer region. The insert can be removed and replaced when eroded, while the outer region of the target source not eroded by the ion beam remains in place attached to a backing plate. The inner insert and the outer region are joined to each other by an interface comprising an interlocking lip or grove structure located on opposing mating surfaces on the inner insert and outer region, thereby forming the deposition target source when these components are united. The deposition target source can be attached by a bonding layer to a backing plate which is installed into an ion beam deposition machine.

8 Claims, 3 Drawing Sheets

ION BEAM DEPOSITION TARGETS HAVING AN INTERLOCKING INTERFACE AND A REPLACEABLE INSERT

PRIORITY CLAIM

This application claims the benefit of U.S. Provisional Application No. 60/247,427, filed Nov. 9, 2000.

BACKGROUND OF THE INVENTION

1. Field of the Invention

The invention relates generally to a target source for thin film sputter deposition, and more particularly to an ion beam deposition target source having an interlocking interface and a replaceable inner central insert.

2. Description of the Prior Art

Sputter deposition processes that use ion beam target sources are found in a variety of applications. Sputter deposition is one of several well known techniques for applying or depositing a thin layer on a substrate. In ion beam bombardment sputtering, a high energy source of ions is directed toward a target source. The force of the bombardment of ions imparts sufficient energy to the atoms of the target source to cause the energized atoms to leave the target source, form a particle flux, and deposit a thin film on a substrate. The advantages of using ion beam sputter deposition include isolation of the substrate from energetic electron bombardment and independent control over the ion energy and current density striking the target. The basic techniques of ion beam sputter deposition are well known in the art.

Generally, any target source material that can be physically placed in a vacuum chamber can be sputtered by ion beam deposition. This includes materials comprised of a single chemical element, alloys, composites, and compounds. In depositing a thin film of a given chemical composition, where the target source is relied on as a primary source of deposition material, the target source can be prepared by vacuum, inert, or open atmosphere melting. The material is melted by induction, resistive, electric arc, or similar melting methods. The material is subsequently formed into an appropriate shape through known material processing methods. Alternatively, the material may be formed by a number of powder consolidation methods such as press and sinter, hot isostatic pressing, uniaxial hot pressing or similar well-known techniques. These methods can be designed to produce material of a high purity and structural integrity. Deposition targets are typically attached to a backing holder or plate by a bonding layer for accurate placement in the vacuum chamber. The bonding layer usually comprises solder. U.S. Pat. No. 4,430,190 to Eilers et al. discloses an example of a deposition target source bonded to a backing holder or plate.

Other factors that can affect the rate and extent of erosion of a deposition target source include the intensity, direction and size of the ion beam used in the sputtering process. However, because the diameter of the ion beam is generally smaller than the dimensions of the deposition target source used, excessive erosion typically occurs on the region of the target source that is directly impacted by the ion beam (typically the center region), while the region of the target source not hit by the ion beam (typically the outer region) demonstrates little to no erosion. Thus, the eroded region will generally correspond to the dimensions of the ion beam bombarding the region.

SUMMARY OF THE INVENTION

In part because of the very high costs of many deposition materials, such as tantalum and precious metals, there is currently a need for producing ion beam deposition target sources that are significantly lower in cost. We have solved this and related problems by producing ion beam deposition target sources that have a replaceable insert which is centrally located to correspond to the region eroded by the ion beam. By developing a deposition target source having a replaceable insert, the region of the target source not eroded by the ion beam can remain in place attached to the holder or frame supporting the target. The ability to remove and replace only the insert portion of the deposition target source eroded by the ion beam saves time and has economic benefits such as reducing the costs associated with materials used to make the target, reducing the costs associated with processing and machining the target source, and permitting the reuse of the remainder of the target not eroded, rather than replacing the entire target source as is currently done.

With the present invention, the replaceable central inner insert can be removed from the vacuum chamber and replaced once eroded, while allowing the outer uneroded portion of the target source to remain attached to a backing holder or plate. Alternatively, if the entire target source and backing plate are returned to a central processing center, both the insert and the outer portion can be removed from the backing plate for inspection by melting or dissolving the bonding layer, and the same outer portion together with a new central insert attached to the backing plate by a fresh bonding layer.

Accordingly, it is a principal object of this invention to provide an ion beam deposition target source having a centrally located inner insert that can be removed and replaced when eroded, wherein the outer region of the target source not eroded by the ion beam can either remain in place attached to a backing plate located on an ion beam deposition (IBD) machine or be reused with a new central insert if the target source is to be removed for more efficient recycling. The deposition target source of the present invention comprises at least a centrally located removable inner insert completely surrounded by an outer region. The inner insert and the outer region are joined to each other to form the deposition target source by an interlocking interface to prevent contaminants, such as atoms from the bonding layer, from also being formed in the particle flux. The deposition target source is attached by the bonding layer to a conventional backing plate located on an IBD machine. The bonding layer preferably comprises solder.

It is another object of this invention to provide an ion beam deposition target source having a geometric shape including, but not limited to, round, rectangular or oval shapes.

It is a further object of this invention to provide a reusable ion beam deposition target source wherein the outer region of the target source not eroded by the ion beam remains attached to the backing plate on an IBD machine, and/or can be reused rather than replaced along with the eroded inner insert.

It is an additional object of this invention to provide an ion beam deposition target source that requires less replacement materials because only the eroded inner insert is replaced, rather than the entire target source.

It is another object of this invention to provide an ion beam deposition target source that reduces the costs and time associated with the processing and machining of a replacement target source because only the eroded inner insert is replaced, rather than the entire target source.

These and other objects of the present invention will become readily apparent upon further review of the following specification and drawings.

DETAILED DESCRIPTION OF THE PREFERRED EMBODIMENTS

Figure 1:
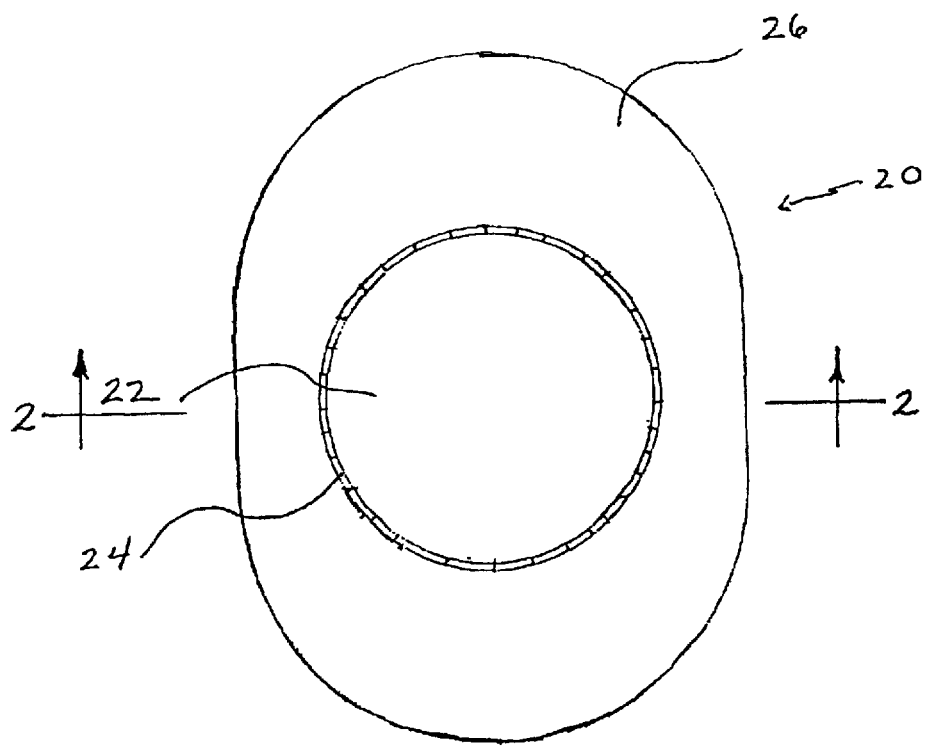
FIG. 1 is a top view of an ion beam deposition target source configuration according to the present invention.

Referring to the drawings in FIGS. 1–7, FIG. 1 depicts a deposition target source 20 of the present invention having an oval shape made in two sections comprising a centrally located inner insert 22, an interlocking interface 24, and an outer region 26 completely surrounding and receiving the inner insert 22 within an central opening of outer region 26. Both the insert 22 and the outer region 26 are made of the same material composition being used as the ion beam deposition material. The interlocking interface 24 joins the inner insert 22 and the outer region 26 by a mechanical interlocking lip or groove structure located on opposing mating surfaces of the inner insert 22 and the outer region 26. The mechanical interlocking lip or groove structure of the interface 24 is depicted in FIGS. 2 and 4–7.

While FIGS. 2 and 4–7 depict alternative embodiments of the interlocking lip or grove structure that comprise interface 24, it should be noted that the actual structure of interface 24 can vary, and is not limited to the structures or shapes shown. Whatever shape or structure is selected for interface 24, it must enable the opposing mating surfaces of inner insert 22 and outer region 26 to mechanically interlock, thereby forming a cohesive deposition target source 20.

Figure 2:
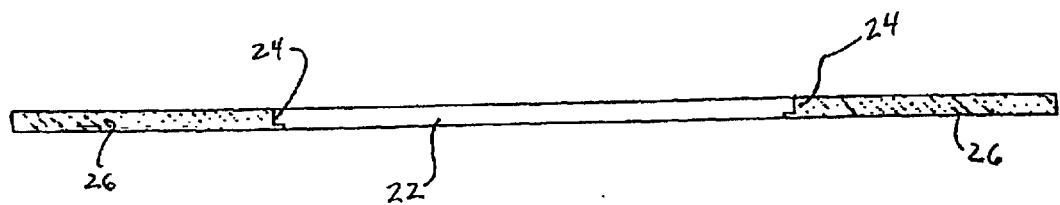
FIG. 2 is a cross sectional view of the interlocking interface taken along line 2—2 in FIG. 1.
Figure 4:
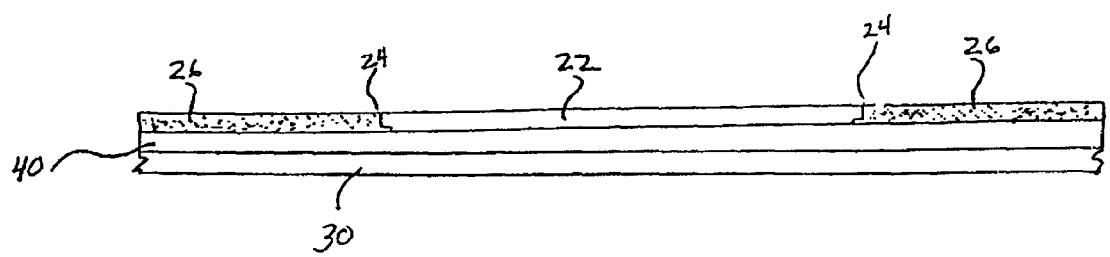
FIG. 4 is a cross sectional view taken along line 4—4 in FIG. 3.
Figure 5:
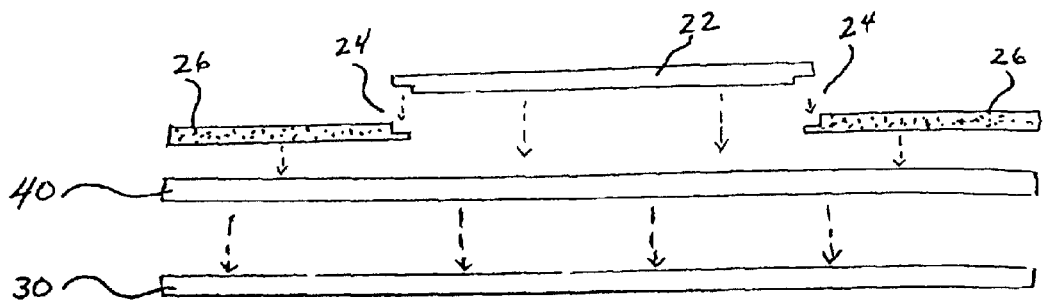
FIG. 5 is an exploded cross sectional view of FIG. 4.
Figure 6:
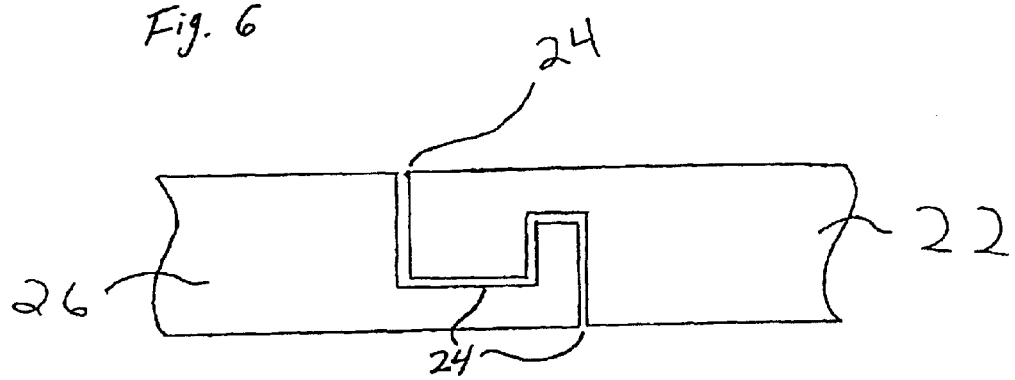
FIG. 6 is a cross sectional view of an alternative interlocking interface embodiment according to the present invention.
Figure 7:
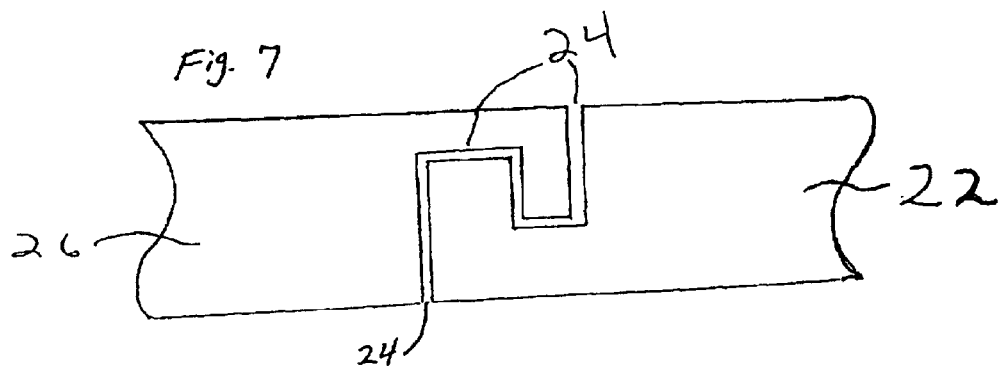
FIG. 7 is a cross sectional view of another alternative interlocking interface embodiment according to the present invention.

As shown in FIGS. 2 and 4, the interface 24 comprises an annular lower lip formed in the outer region 26 and an annular upper lip formed in the insert 22 and mating with the lower lip to form the two-part cohesive target source 20. The interface 24 as shown in FIG. 6 further enhances the cohesiveness of the target source 20 by the formation of an annular groove in the upper lip mating with an annular ridge formed on the lower lip. Alternatively, and as shown in FIG. 7, the upper and lower lips of FIG. 6 are reversed to provide a positive mechanical lock to retain the insert 22 in position along with bonding to a backing plate 30 as will be described.

In addition to providing a mechanical interlocking feature, interface 24 depicted in FIGS. 2 and 4–7 also enables molten solder or other molten bonding material used to attach the target source 20 to the backing plate 30 to become trapped or contained within the lip or grove structure, preventing molten solder or other bonding material from inadvertently contaminating the front surface of the target source 20.

Figure 3:
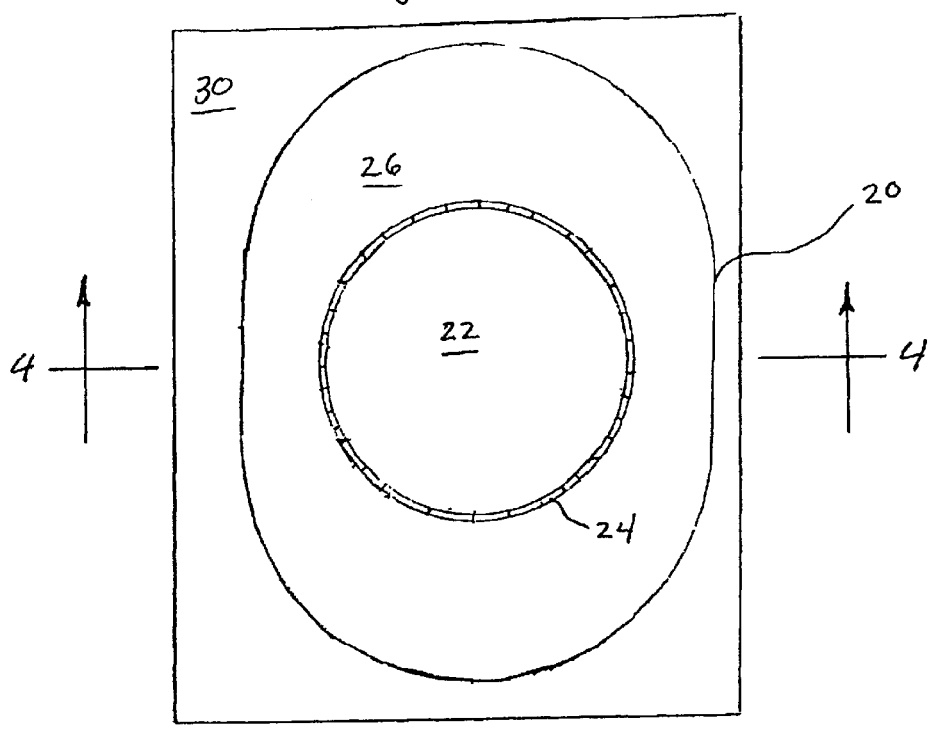
FIG. 3 is a top view of the deposition target source according to the present invention attached to a backing plate.

FIGS. 3 and 4 depict target source 20 attached to a backing plate 30 of an IBD machine (not shown) by a bonding layer 40. The bonding layer 40 is preferably solder, and the target source 20 is bonded to the backing plate 30 when molten solder or bonding material constituting the bonding layer 40 solidifies, adhering the back or rear side of the target to the backing plate 30. Once the inner insert 22 becomes sufficiently eroded such that replacement is required, the backing plate 30 is heated to a temperature sufficient to melt the solder constituting the bonding layer 40, thereby permitting the removal of the eroded inner insert 22 from the backing plate 30. Upon removal of the eroded inner insert 22, a new inner insert replacement can be joined to the remaining outer region 26 by engaging the interlocking lip structure located on the opposing mating surfaces of the inner insert 22 and the outer region 26, thereby forming interface 24. The new uneroded inner insert 22 is then soldered to the backing plate 30. Alternatively, if the entire target/backing plate assembly is sent to a processing center for recycling, both inner insert 22 and outer region 26 may be removed for inspection and cleaning of outer region 26 and backing plate 30 before reattaching outer region 26 to backing plate 30 using a new insert 22.

While target source 20 is depicted in the FIGS. 1–4 as having an oval shape, the target source 20 can be made into a variety of shapes and sizes, and consist of a variety of materials including, but not limited to, metal and metal alloys, composites, ceramic compounds, and other chemical compositions. In a preferred embodiment, the ion beam deposition target source 20 consists of geometric figures having the following shapes and dimensions, including, but not limited to, a round shape having a diameter from about 10" to about 16", an oval shape having a dimension of about 9"×12", and a rectangular shape having the dimensions of about 10"×14".

While the invention has been described with reference to preferred embodiments, it will be understood by those skilled in the art that various changes may be made and equivalents may be substituted for elements thereof without departing from the scope of the invention. In addition, many modifications may be made to adapt a particular situation of material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

We claim:

1. A deposition target source for ion deposition of a material onto a substrate and made of two parts of the same deposition material, both parts of which are exposed to an ion beam in a vacuum chamber when in use, one part comprising an inner insert having at least one mating surface and having an erodable surface area substantially corresponding to the target region eroded by the ion beam, the other part comprising a separate outer region substantially outside the eroded region and defining a central opening to receive the inner insert with the outer region substantially surrounding the inner insert the outer region and having a surface detachably mating with the mating surface of the inner insert; and an interlocking interface formed by the mating surfaces of the inner insert and the outer region, both to form a cohesive deposition target source from the inner insert and the outer region and to enable detachment of the inner insert for replacement after ion deposition.

2. A target source according to claim 1, wherein the interlocking interface comprises a mechanical interlocking lip structure to prevent contaminants from passing between the mating surfaces of the inner insert and outer region.

3. A target source according to claim 2, wherein the mechanical interlocking lip structure comprises a first annular lip formed at the central opening of the outer region, and an annular mating lip formed on the inner insert.

4. A target source according to claim 1, wherein the inner insert and the outer region each define a rear surface, and further comprising a backing plate affixed to the rear surfaces of the inner insert and outer region.

5. A target source according to claim 4, and further comprising a bonding layer of solder to affix the backing plate.

6. A deposition target source for ion deposition of a material onto a substrate and made of two parts of the same deposition material, one part comprising an inner insert having at least one matins surface, the other part comprising a separate outer region defining a central opening to receive the inner insert with the outer region substantially surrounding the inner insert, the outer region having a surface detachably mating with the mating surface of the inner insert; and an interlocking interface formed by the mating surfaces of the inner insert and the outer region, both to form the a cohesive deposition target source from the inner insert and the outer region and to enable detachment of the inner insert for replacement after ion deposition, the interlocking interface comprising a mechanical interlocking lip structure to prevent contaminants from passing between the mating surfaces of the inner insert and outer region with a first annular lip formed at the central opening of the outer region, and an annular mating lip formed on the inner insert wherein one of the lips defines an annular groove and the other of the lips defines an annular ridge mating with the groove.

7. A method of reusing an eroded deposition target source used for ion deposition of a material from the target source, comprising the steps of:
(a) forming the target source in two separate parts made of the same deposition material both parts of which are exposed to an ion beam in a vacuum chamber when in use, one part comprising an insert, from which the material is to be used for deposition and having an erodable surface area substantially corresponding to the target region eroded by the ion beam, and an outer part substantially outside the eroded region and surrounding the insert by an interlocking interface to prevent contaminants from passing between the parts;
(b) affixing both parts to a backing plate to form a cohesive assembly for insertion into an ion beam deposition machine for deposition of material substantially from the insert onto a substrate, thereby eroding the insert; and
(c) removing from the ion beam deposition machine at least the insert after deposition and replacing it in the ion beam deposition machine with a new uneroded insert for further deposition using material from the new uneroded insert.

8. The method according to claim 7, and comprising the step of removing the entire assembly after deposition, detaching at least the eroded insert from the backing plate, and replacing the eroded insert by affixing a new uneroded insert to the backing plate and reusing the outer part and the new uneroded insert for further deposition in the ion beam deposition machine.

* * * * *

UNITED STATES PATENT AND TRADEMARK OFFICE
CERTIFICATE OF CORRECTION

PATENT NO. : 6,755,944 B2
DATED : June 29, 2004
INVENTOR(S) : Grohman et al.

It is certified that error appears in the above-identified patent and that said Letters Patent is hereby corrected as shown below:

<u>Title page,</u>
Item [75], Inventors, "Matthew T. Wilson, New Milford, CT (US)" should read
-- Matthew T. Willson, New Milford, CT (US) --.
Item [57], ABSTRACT,
Line 7, change "grove" to -- groove --.

<u>Column 3,</u>
Lines 38 and 62, change "grove" to -- groove --.

<u>Column 4,</u>
Line 53, change the comma "," to a semicolon -- ; --.

<u>Column 5,</u>
Line 15, change "matins" to -- mating --;
Line 15, insert a semicolon -- ; -- between the words "surface" and "the";
Line 22, delete first instance of "the" at the beginning of the line.

Signed and Sealed this

Twenty-third Day of May, 2006

JON W. DUDAS
*Director of the United States Patent and Trademark Office*